United States Patent Office 3,306,745

Patented Feb. 28, 1967

3,306,745

PHOTOPOLYMERIZABLE COMPOSITIONS, ELEMENTS AND PROCESSES

Vincent Joseph Webers, Red Bank, N.J., assignor to E. I. du Pont de Nemours and Company, Wilmington, Del., a corporation of Delaware No Drawing. Filed Aug. 19, 1963, Ser. No. 303,134
7 Claims. (Cl. 96—35.1)

This invention relates to new photopolymerizable compositions, layers, elements and processes.

Solid compositions capable of polymerization under the influence of actinic light to rigid, insoluble, tough polymer-containing structures are known. Compositions of this type are described in Plambeck U.S. Patents 2,760,863 and 2,791,504. Additional photopolymerizable compositions are described in Martin U.S. 2,729,710, Barney U.S. 2,893,868 and Martin and Barney U.S. 2,927,022. The compositions described in these references are particularly useful for the preparation of photopolymerizable printing plates including line and half-tone printing plates.

An object of this invention is to provide improved photopolymerizable elements, layers and compositions which may be used for the preparation of low contrast gravure or relief printing plates. A further object is to provide a process for the preparation of such plates. Still further objects will be apparent from the following detailed description.

The above objects are attained by the photopolymerizable composition of this invention which comprises: (a) a preformed compatible macromolecular polymer binding agent that forms coherent, solid films (3 to 97 parts by weight), (b) a non-gaseous, addition polymerizable ethylenically unsaturated compound containing at least one terminal ethylenic group capable of forming a high polymer by photoinitiated addition polymerization in the presence of an addition polymerization initiator therefor activatable by actinic light (97 to 3 parts by weight), (c) from 0.0001 to 6% by weight of the total composition of such an initiator, and (d) from 0.0001 to .01% by weight of the total composition of a chalcogen selected from the group consisting of sulfur and selenium.

The photopolymerizable layers of the invention comprise an unsupported solid sheet or a layer of the foregoing composition on a suitable support. The composition or layer may, of course, contain other materials such as solvents, plasticizers, finely divided fillers, thermal polymerization inhibitors, etc.

The term "chalcogen" has been adopted as a generic term to cover the elements of oxygen, sulfur, selenium and tellurium. (See Journal of the American Chemical Society, vol. 63, p. 889.)

The new compositions of this invention can be prepared in many ways from the four essential constituents specified above by admixing them in any order, and, if desired with the aid of a solvent. Conventional milling, mixing, and solution techniques can be applied, the particular technique varying with the difference in properties of the respective components. Care must be taken in preparing a homogeneous admixture of these four components, along with any other added materials, in order not to activate the polymerization initiator so as to induce polymerization, or to induce polymerization in any other manner, or to degrade any of the components.

The invention also includes elements suitable for the preparation of low contrast gravure or relief printing plates comprising an adherent support having superposed thereon a solid layer of the above described photopolymerizable composition from 1 to 250 mils in thickness. For intaglio or gravure printing uses, a relatively thin layer of the photopolymerizable composition is most suitable, e.g., 1 to 50 mils in thickness; for other uses such as relief maps, cameo and intaglio art objects, etc., somewhat thicker layers may be more useful.

In a preferred embodiment of these elements, the support is a flexible film such as polyethylene, terephthalate. Other supports, however, are also useful, e.g., metal plates or sheets or foils. Other suitable supports are disclosed in U.S. Patent 2,760,863 and this patent also discloses various anchor layers which may be used to provide strong adherence between the base and the photopolymerizable layer. The adhesive compositions disclosed in U.S. Patent 3,036,913 are also very effective.

An anti-halation material can be present in this support, or in a layer or stratum on the surface of the support, or can be contained in the anchor layer. With transparent or translucent supports, the antihalation material may be on the rear surface of the element. When antihalation material is used it preferably should be sufficiently absorptive of actinic light to permit the reflectance from the support or combined support of no more than 35% of incident actinic light.

To form a gravure printing plate, the photopolymerizable element is exposed to actinic light through a gravure screen and through a suitable transparency. In the prior art it is normally necessary that the transparency through which the exposure is made be a process transparency, e.g., a process negative or positive (an image-bearing transparency consisting solely of substantially opaque and substantially transparent areas where the opaque areas are substantially of the same optical density, the so-called line or half-tone negative or positive). According to this invention, however, it is possible to expose the photopolymerizable layer through continuous tone transparencies and, because of the low contrast of these elements, gravure printing plates can be produced which will have the necessary tonal range for satisfactory reproductions of the original image.

Elements of the present invention may be exposed by reflex methods. However, unless the photopolymerizable layer is very thin, it is ordinarily preferred to expose directly, i.e., through a photographic transparency (e.g. line, halftone or continuous tone) as resolution may be obtained by direct exposure.

The exposure can be accomplished using any of a number of sources of actinic radiation. Suitable sources include carbon arcs, mercury-vapor arcs, fluorescent lamps with special ultraviolet-radiation-emitting phosphors, argon glow lamps and photographic flood lamps. The point sources, e.g., carbon arc, etc., are generally used at distances of 15 to about 40 inches from the photopolymerizable element. Broad radiation sources can be used at a distance up to 24 inches from the photopolymerizable surface. The distance may vary, however, depending on the strength of the radiation source and the time required for exposure.

Exposure is preferably carried out in a vacuum printing frame so as to obtain good contact between the original transparency and the photopolymerizable stratum. Additionally, the vacuum printing frame permits the removal of oxygen (which inhibits the polymerization reaction) and consequently reduces the exposure required for image reproduction. Oxygen inhibition can also be overcome by the use of a cover sheet during exposure which is transparent to active radiation but impermeable or semi-permeable to oxygen.

After exposure, the elements are processed or developed by washing out the underexposed areas. Suitable aqueous washout solutions for the preferred photopolymerizable compositions include, preferably, alkali metal hydroxides, e.g., sodium and potassium, and in addition, ammonium, ammonium-substituted hydroxides and the basic reacting salts of the alkali metal hydroxides, especially those of weak acids, e.g., the carbonates, bicarbonates and acetates. Generally the base will be present in concentrations ranging from about 0.01 to about 10 percent, although normally solutions greater than about 5 percent will not be used. The washout solution for removing the unpolymerized areas may be applied in any conventional manner, as by pouring, immersion, splashing with paddles and brushing or spraying. Other photopolymerizable compositions may be developed by using non-aqueous solvents as disclosed, for example, in U.S. 2,760,863.

In the following examples, which are submitted to illustrate further the invention but not to limit it, the abbreviation C.I. refers to the Colour Index, 2nd edition, 1956, The Society of Dyers and Colourists, Dean House, Picadilly, Bradford, Yorkshire, England, and the American Association of Textile Chemists and Colorists, Lowell Technological Institute, Lowell, Massachusetts, U.S.A. The percentages are by weight.

EXAMPLE I

A solution was prepared by carefully mixing the following ingredients:

*Solution A (control)*

| | G. |
|---|---|
| Cellulose acetate succinate | 11.25 |
| Polyethylene glycol diacrylate | 5.15 |
| 9,10-anthraquinone | 0.0005 |
| Ethyl alcohol | 1.58 |
| Acetone to 63.0 g. | |

The cellulose acetate succinate contained 1.8 acetate groups and 0.8 succinate group per anhydroglucose unit. A 1% solution in 92% acetic acid had a viscosity of 3.0 cps. at 20° C. and an inherent viscosity of 1.6 in the same solvent. The polyethylene glycol diacrylate was derived from the precursor glycol having an average molecular weight of 300.

Another solution labelled "B" was prepared in the same manner except for the addition of 0.50 ml. of a sulfur solution made from 0.25 gram of sulfur per liter of solution, carbon disulfide being the solvent (7.6 parts per million of sulfur).

A support for these two coating solutions was prepared from 4-mil polyethylene terephthalate film base by applying to one side a thin substratum coating of polypiperazine ethylene urethane from a 5% solution of the polymer in dichloromethane. This polyurethane is the reaction product of piperazine and ethylene-bis-chloroformate, prepared as taught in Example I of U.S. 2,731,446. On the opposite side of the film base there was coated at a wet-thickness of 8 mils, a non-halation solution comprising 10 g. of a 2% by weight acetone solution of the ultraviolet absorber (2-hydroxy-4-methoxybenzophenone), 26 g. cellulose acetate butyrate (as defined in Example IV) and 107 g. acetone. The non-halation layer is particularly useful for the proper development of wells when the element is used for the preparation of a gravure plate.

The two coating solutions described above, A and B, were coated over the polyurethane adhesive subbing layer to a wet thickness of 15 mils and the resulting coatings were dried at room temperature in yellow safe lights. These coatings (or plates) were then exposed by transmission in a water-cooled vacuum printing frame (Fairchild Exposure Unit Model F386.1), at a pressure of about 120 mm. of mercury, through a pre-screened step wedge with the mercury arc maintained at a distance of 1⅜ inches, the arc moving at a rate of 75 inches per minute. Coating A was exposed with 4 passes of the moving arc while coating B was exposed with 32 passes.

By a "pre-screened step wedge" is meant a step wedge in which a regular pattern of transparent lines is superimposed on an ordinary step wedge having gradations in optical density. The pre-screened step wedge used in these examples was prepared in the following way: A negative of a 150-line gravure screen (i.e., a screen composed of black lines and white squares) was placed emulsion side down against the emulsion side of a blue-sensitive, low speed, moderate contrast copying film of a type used in the photomechanical trade. Over these superposed films was placed an optical step wedge, emulsion side down. The combination was exposed, using collimated light, and developed. A similar exposure was made on another sheet of the same photographic copying film but with omission of the 150-line negative gravure screen, in order to obtain a step wedge wherein the optical density of each step would be equal to that of the dark areas (small squares) of the corresponding pre-screened positive transparency. The densities, thus obtained are as follows:

| Step No.: | Optical density |
|---|---|
| 20 | 1.57 |
| 19 | 1.50 |
| 18 | 1.45 |
| 17 | 1.40 |
| 16 | 1.34 |
| 15 | 1.27 |
| 14 | 1.20 |
| 13 | 1.13 |
| 12 | 1.03 |
| 11 | 0.90 |
| 10 | .75 |
| 9 | .60 |
| 8 | .49 |
| 7 | .40 |
| 6 | .32 |
| 5 | .26 |
| 4 | .23 |
| 3 | .18 |
| 2 | .16 |
| 1 | .14 |

In addition, a "step 21" was often included with a density in the squares over 2.0. Best results were obtained when the transparency used for exposure had a matte surface so that air could flow out from between the transparency and the photopolymerizable stratum during evacuation.

The coating containing sulfur was sensitometrically slower than the control, so a greater exposure was used as indicated above. After exposure, the plates were developed by washing at 80° F. for 10 minutes using a uniform spray of 0.04 N NaOH. The well depths, measured with an interference microscope at different steps of the wedge, were as follows:

| Step No. | 21 | 20 | 19 | 17 | 15 | 13 | 12 | 11 |
|---|---|---|---|---|---|---|---|---|
| | Well depth | | | | | | | |
| Coating: | | | | | | | | |
| A | 1.02 | .92 | .92 | .97 | 1.00 | .95 | .56 | .40 |
| B | .96 | .87 | .71 | .61 | .54 | .46 | .30 | .20 |

These measurements show that the B coating has a gradation in well depth suitable for a gravure plate, but that the A coating does not. When exposure and development were carried out as above with both plates, but using a pre-screened positive transparency of a picture instead of a step wedge, gravure plates were obtained. These were printed manually by swabbing a black printing ink on each of the plates, wiping off the excess, and pressing the inked plate against dampened paper as described for engraved copper plates in Ellis, Printing Inks, Reinhold Pub. Co., N.Y. (1940), pages 19 and 20.

The prints obtained from the plate made with coating A were very contrasty, essentially black and white, whereas the plate made with coating B gave prints of lower contrast, showing gradation in tone with the various shades of gray necessary to represent the picture.

A similar coating was made using a 0.25 gram per liter solution of sulfur in carbon tetrachloride with similar results. (Thus, there is nothing unique in the use of carbon disulfide an the solvent.) Coating solutions with only one-tenth to one-third as much of the sulfur (in carbon disulfide solvent) gave elements with noticeable gradation in well depth, but the rendition of various shades of gray was insufficient to give good normal gravure prints.

EXAMPLE II

Three coating solutions were made up. One, Solution A, contained the following:

| | G. |
|---|---|
| Cellulose acetate succinate (as in Example I) | 8.01 |
| Triethylene glycol diacrylate | 3.55 |
| Hydroquinone monomethyl ether | .045 |
| 2-ethyl-9,10-anthraquinone | .045 |
| Acetone to a total of 60.0 g. | |

The second solution, B, was the same except for the addition of 0.4 ml. of a solution made up from 0.25 gram of sulfur and one liter of carbon tetrachloride.

The third solution, C, was the same as A, except for the addition of 0.4 ml. of a solution made up from 0.25 gram of selenium and one liter of carbon tetrachloride. All three solutions were coated at a wet thickness of 15 mils, and dried as in Example I.

The exposure was performed as follows: A portion of each plate was masked, while the remainder was exposed using 8 passes of the Fairchild exposure device of Example I through a gravure screen (black squares, transparent lines). The emulsion side of the screen was placed in contact with the plate. The screen and mask were then removed and a continuous tone step wedge was placed so that part of it covered a strip that had been previously exposed with the screen, and part of it covered an area previously unexposed. This step wedge had steps ranging in density from .05 to 3.05 in twenty-one distinct steps (a square-root-of-two step wedge). Step No. 1 of the wedge had the lowest optical density. The coatings were developed by washout as in Example I, and well depths were measured as in Example I using an interference microscope in those areas that had been given a screened exposure. In the other exposed areas which had only been exposed through the continuous tone wedge, relief height (height of remaining coating above the support) was measured with a micrometer.

EXAMPLE III

A coating composition was prepared by mixing, at room temperature, the following materials:

| | | |
|---|---|---|
| Cellulose acetate butyrate | g. | 10 |
| Polyethylene glycol diacrylate (as in Example I) | g. | 10 |
| 2-ethyl-9,10-anthraquinone | g. | 0.1 |
| Sulfur solution in $CCl_4$ (0.25 g. per liter of solution) | ml. | 0.5 |
| Acetone | g. | 60.0 |

The cellulose acetate butyrate contained 13±0.2% acetyl groups, 37±0.2% butyral groups and had a viscosity of 1.12 to 1.88 poises determined by the ASTM method D–1343–54T in the solution described as Formula A ASTM method D–871–54T. The refractive index was 1.475 and the specific gravity was 1.20.

The above composition was coated and exposed as described in Example I. Since the cellulose acetate butyrate is water- and alkali-insoluble, the exposed plates were washed out in a manner similar to that used in Example I but using acetone as the solvent. With an exposure as described in Example I, using 8 passes, the well depths were measured at the various exposure levels giving the following results;

| Exposure Step No.: | Well Depth (mils) |
|---|---|
| 21 | 2.1 |
| 20 | 1.9 |
| 19 | 1.8 |
| 17 | 1.7 |
| 15 | 1.5 |
| 13 | 1.2 |
| 11 | 1.2 |

EXAMPLE IV

A coating composition was prepared containing the following materials:

*Solution A*

| | G. |
|---|---|
| Cellulose acetate butyrate/cellulose acetate (25% by weight solution in $CH_2Cl_2$) | 10.62 |
| Pentaerythritol triacrylate | 2.585 |
| 9,10-phenanthrenequinone | 0.03 |
| Dye [1] (2% by weight solution in methylcellosolve) | 1.405 |
| Polyethylene glycol of molecular weight 4000 | 0.078 |
| $CH_2Cl_2$ to 25.0 g. | |

[1] Pontacyl Wool Blue BL (C.I. Acid Blue 59).

| Step No. | 21 | 20 | 19 | 17 | 15 | 13 | 11 | 9 | 7 | 5 | 3 |
|---|---|---|---|---|---|---|---|---|---|---|---|
| | Well Depth | | | | | | | | | | |
| Ctg. A, 4 passes | 2.0 | 2.0 | 1.9 | 2.0 | 1.9 | 1.8 | 1.1 | 0.4 | 0 | 0 | 0 |
| Ctg. B, 8 passes | 2.0 | 1.9 | 1.8 | 1.6 | 1.2 | 0.9 | 0.7 | 0.6 | 0.4 | 0.3 | 0.1 |
| Ctg. C, 8 passes | 1.8 | 1.7 | 1.6 | 1.4 | 1.2 | 1.0 | 0.8 | 0.7 | 0.6 | 0.4 | 0.2 |

| Step No. | 1 | 2 | 3 | 5 | 7 | 9 | 11 | 13 | 15 | 17 | 19 |
|---|---|---|---|---|---|---|---|---|---|---|---|
| | Relief Height | | | | | | | | | | |
| Ctg. A, 2 passes | 2.9 | 2.0 | 2.0 | 1.9 | 2.0 | 1.3 | .3 | 0 | 0 | 0 | 0 |
| Ctg. B, 8 passes | 2.1 | 1.9 | 1.8 | 1.7 | 1.6 | 1.4 | 1.2 | 1.1 | 1.0 | 0.9 | 0.9 |
| Ctg. C, 8 passes | 2.2 | 2.1 | 2.0 | 1.9 | 1.8 | 1.7 | 1.5 | 1.2 | 0.9 | 0.8 | 0.7 |

Thus it can be seen that inclusion of small amounts of a sulfur or selenium inhibitor is quite effective in lowering the contrast, either for gravure plates or for conventional relief images.

The polymeric binder above was a mixture in the ratio of 10 parts of cellulose acetate butyrate (as described in Example III) to 7 parts of cellulose acetate which had an acetyl content of 39±1%, viscosity of 64–132 poises (measured according to ASTM procedure described in Example III) and a specific gravity of 1.30.

Solution B was prepared in the same manner as the above described Solution A except for the addition of 0.2 ml. of a solution of sulfur in carbon tetrachloride (0.25 gram of sulfur per liter of solution).

Solution A and Solution B were both coated as in Example I and the resulting plates were exposed to a 2800-watt carbon arc at a distance of 15 inches for 10 seconds. The exposure was through a continuous tone positive transparency containing a 10-step continuous tone step wedge. A relief image was formed by washing out with acetone spray (at room temperature) until the image became clear.

Plate A, containing no sulfur inhibitor, had only three distinct tone steps. Because of the presence of the blue dye, the areas of the plate corresponding to exposure steps Nos. 8, 9 and 10 (lowest optical density) visually appeared to be uniformly dark. The areas corresponding to exposure step No. 7 was intermediate in density while areas corresponding to exposure steps No. 1 (highest optical density) through No. 6 were uniformly of a lighter color.

Plate B, containing the inhibiting sulfur, had twice the number of visibly distinct tone steps. Areas corresponding to exposure steps Nos. 9 and 10, indistinguishable from one another, were darkest. Areas corresponding to exposure steps 1, 2, 3, and 4 (also indistinguishable, one from the other) were the lightest in color. Areas corresponding to exposure steps 5, 6, 7 and 8 were individually distinguishable from one another as well as from the lightest and darkest areas so that there were a total of 6 visually distinguishable tone steps. Thus the effect of the sulfur, in lowering the contrast of the plate, made it possible to reproduce a continuous tone image in a plate which would not otherwise have been capable of having a sufficient number of tone steps.

EXAMPLE V

A coating solution was prepared from the following materials:

*Solution A*

| | G. |
|---|---|
| Polyacrylic acid (25% by weight solution in acetone) | 16 |
| Triethylene glycol diacrylate | 4 |
| Benzoin methyl ether | 0.08 |
| Acetone to 28.0 g. | |

A 6.6% aqueous solution of the polyacrylic acid had a viscosity of 8.9 centistokes at 78° F. and a pH of approximately 2.0.

Solution B was prepared in a similar manner except that, within the 28 g. of coating solution, there was included 3.2 ml. of a solution of sulfur in carbon tetrachloride (0.25 g. of sulfur per liter of solution).

In order to make the relief images to be obtained from these plates more visible, a red dye (Oil Red 2B CI26105) was dissolved in the polymerizable monomer (the triethylene glycol diacrylate) at a concentration of 2.5% by weight.

Plates were prepared by coating Solutions A and B as described in Example IV. Exposure was similar to that described in Example IV, using a 2800-watt carbon arc at a distance of 15 inches for 30 seconds. The plates were developed as in Example IV and again it was observed that Control Coating A produced a very high contrast relief image so that only three tone steps were observable. Plate B produced a relief image with 6 tone steps individually distinguishable so that it was possible, with plate B, to reproduce a continuous tone relief image.

The instant invention is not limited to the particular photopolymerizable compositions of the examples. Suitable compositions which can be used are described in Plambeck U.S. Patents 2,760,863 and 2,791,504. Other photopolymerizable compositions which can be used are described in the patents of assignee as follows:

(1) N-methoxymethyl polyhexamethylene adipamide mixtures of Saner, British specification No. 826,272.

(2) Linear polyamide compositions containing extralinear N-acrylyloxymethyl groups of Saner et al., U.S. Patent 2,972,540.

(3) Polyvinyl acetal compositions having the extralinear vinylidene groups of Martin U.S. Patent 2,929,710.

(4) Polyester, polyacetal or mixed polyester acetal mixtures of Martin U.S. Patent 2,892,716.

(5) Blends of selected organic-soluble, base-soluble cellulose derivatives with addition-polymerizable components and photoinitiators of Martin et al. U.S. Patent 2,927,022.

(6) Polyvinyl alcohol derivatives of Martin U.S. Patent 2,902,365.

(7) 1,3-butadiene compositions of McGraw U.S. Patent 3,024,180.

Photopolymerizable compositions useful in this invention have been previously described (see above). These compositions comprise addition-polymerizable ethylenically unsaturated compounds, addition-polymerization initiators and, preferably, thermal addition polymerization inhibitors.

Suitable addition-polymerizable ethylenically unsaturated compounds, in addition to the preferred triethylene glycol diacrylate and polyethylene glycol diacrylates with an average molecular weight of the diol precursor of 200 to 600, include vinylidene monomers, particularly the vinyl monomers described in Plambeck U.S. Patent 2,791,504 col. 17 line 62 to col. 18 line 16, acrylic or methacrylic acid esters of diethylene glycol, triethylene glycol and higher polyalkylene glycols, e.g., methoxytriethylene glycol acrylate, ethylene glycol dimethacrylate, diethylene glycol diacrylate, methoxytriethylene glycol methacrylate, di- and triethylene glycol acrylates, and methacrylates, the acrylates, diacrylates, methacrylates and dimethacrylates of tetraethylene glycol, dipropylene glycol, and polybutylene glycols. Still other useful compounds include the diacrylates and dimethacrylates of ether-glycols which also contain a combined intrachain dibasic acid unit, e.g., the diacrylate or dimethacrylate of $$\begin{array}{l} HOCH_2CH_2OCH_2CH_2O{-}OCRCOOCH_2 \\ \qquad\qquad\qquad\qquad\qquad\qquad CH_2OCH_2CH_2OH \end{array}$$

where R is a divalent hydrocarbon radical, e.g., methylene or ethylene. Other useful vinyl monomers include glycerol triacrylate and 1,2,4-butanetriol trimethacrylate. Still other suitable polymerizable compounds are the pentaerythritol esters disclosed in assignee's Celeste and Bauer U.S. application Serial No. 274,909, now Patent No. 3,261,686, filed April 23, 1963, Patent No. 3,261,686, July 19, 1966.

An addition polymerization initiator activatable by actinic radiation (preferably from 1800 to 7000 A.) and which is not appreciably active thermally below 50° C. is added in amount of from 0.0001 to 10 parts by weight, preferably 0.001 to 0.2 part by weight. The concentration of initiator is chosen between these limits so that there is sufficient initiator present to effect polymerization, but on the other hand, the initiator concentration is not to be so great that light is appreciably attenuated as it passes into the coating. For the latter reason, there should be very little, and preferably none of any pigment or dye which absorbs very strongly at the actinic wave length. Dyes and colorants which do not absorb appreciably at the actinic wave lengths may, of course, be desirably included in the composition.

Examples of initiators inactive thermally at 85° C. and below are vicinal ketaldonyl compounds such as diacetyl, benzil, etc., α-ketaldonyl alcohols such as benzoin, pivaloin, etc., acyloin ethers such as benzoin methyl or ethyl ethers, alphahydrocarbon substituted aromatic acyloin including α-methylbenzoin, α-allylbenzoin and α-phenylbenzoin.

Preferably, however, the photoinitiators are thermally inactive below 185° C. The anthraquinone photoinitiators fall within this range. Suitable initiators include 9, 10-anthraquinone, 9,10-phenanthrenequinone, 1-chloroanthraquinone, 2-chloroanthraquinone, 2-methylanthraquinone, 2-tert-butylanthraquinone, octamethylanthraquinone, 1,4-naphthoquinone, 1,2-benzanthraquinone, 2, 3-benzanthraquinone, 2-methyl-1,4-naphthoquinone 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone alpha sulfonic acid, 3-chloro-2-methylanthraquinone, retenequinone, 7,8,9,10-tetrahydronaphthacenequinone, and 1,2,3, 4-tetrahydrobenz[a]anthracene-7,12-dione.

The photopolymerizable layers may also, if desired, comprise other compatible monomeric or polymeric polyunsaturated materials which, under the influence of actinic light, polymerize to crosslinked insoluble polymers. These agents improve the rate or extent of the crosslinking throughout the photopolymerizable layer, and their presence facilitates the removal of the unexposed areas; they also serve to plasticize the compositions when an initially softer composition is desired. A useful class of such materials are the monomers or low polymers containing two terminal ethylenic unsaturations, preferably in non-conjugated systems. Suitable examples are the methacrylic and acrylic acid diesters of ethylene glycol, diethylene glycol, and the low molecular weight polyethylene glycols; methacrylic and acrylic acid diesters of polymethylene glycols such as trimethylene glycol, hexamethylene glycol, etc.; divinylbenzene, crotyl methacrylate, diallyl phthalate, diallyl maleate, triallyl cyanurate, etc. These additional crosslinking agents are preferably used in amounts between 1% and 40% by weight of the total compositions.

The photopolymerizable layers can also contain immiscible polymeric or non-polymeric organic or inorganic fillers or reinforcing agents which are essentially transparent, e.g., the organophilic silicas, bentonites, silica, powdered glass, etc. having a particle size less than 0.4 mil and in amount varying with the desired properties of the photopolymerizable layer.

Even when containing monomeric or low polymeric additives as described above, the photopolymerizable compositions of this invention are solids. While their hardness varies from medium hard to very hard, they are nevertheless substantially non-deformable under ordinary conditions, and non-tacky. Thus, they offer considerable physical advantages over photopolymerizable compositions obtained as liquids, viscous liquids or semisolid gels from the standpoint of forming into convenient elements for commercial printing use.

The compositions of this invention are useful in the manufacture of relief elements which are produced by a photographic process. The unusually low contrast of the photopolymerizable elements makes them well suited for exposure through continuous-tone negative or positive transparencies. An especially useful feature of these elements resides in the fact that they can be exposed and processed from the same side. This permits the use of supports which may be completely opaque to the exposing radiation. This is often desirable in order to secure protection against halation. These elements may be used for the production of gravure printing plates, decorative objects such as cameos or intaglio relief images, printed circuits, relief maps, combinations within a single plate of type and pictorial matter, etching results, etc.

An advantage of this invention is that it extends the utility of image reproduction via the photopolymerization process. It is now possible, in a photopolymerizable element, to achieve the low contrast reproduction necessary to make satisfactory gravure printing plates and continuous-tone, three dimensional reproductions. These elements are typically exposed by placing the emulsion side of an original photographic transparency directly against the surface of the photopolymerizable stratum, said surface subsequently becoming the printing surface of the gravure plate resulting from the wash-out development. This direct contact between the original photographic emulsion and the ultimate gravure printing surface substantially eliminates diffusion of printing light and thus accounts for the high resolution obtainable. Furthermore, it is not required that the exposing light be well collimated. Good results can be obtained even with fairly diffuse exposing light. Still other advantages will be apparent to those skilled in the art.

I claim:

1. A photopolymerizable composition comprising:

(a) a preformed compatible macromolecular polymer binding agent that forms coherent, solid films in an amount of 97 to 3 parts by weight, (b) a non-gaseous, addition polymerizable ethylenically unsaturated compound containing at least one terminal ethylenic group capable of forming a high polymer by photoinitiated addition polymerization, in the presence of an addition polymerization initiator therefor activatable by actinic light, in an amount of 97 to 3 parts by weight, (c) from 0.0001 to 6% by weight of the total composition of such an initiator, and (d) from 0.0001 to .01% by weight of the total composition of a chalcogen selected from the group consisting of sulfur and selenium.

2. A solid photopolymerizable layer comprising:

(a) a preformed compatible macromolecular polymer binding agent that forms coherent, solid films in an amount of 97 to 3 parts by weight.

(b) a non-gaseous, addition polymerizable ethylenically unsaturated compound containing at least one terminal ethylenic group capable of forming a high polymer by photoinitiated addition polymerization, in the presence of an addition polymerization initiator therefor activatable by actinic light, in an amount of 97 to 3 parts by weight.

(c) from 0.0001 to 6% by weight of the total composition of such an initiator, and (d) from 0.0001 to .01% by weight of the total composition of a chalcogen selected from the group consisting of sulfur and selenium.

3. An image-yielding element comprising a support bearing a solid layer from 1 to 250 mils in thickness comprising:

(a) a preformed compatible macromolecular polymer binding agent that forms coherent, solid films in an amount of 97 to 3 parts by weight, (b) a non-gaseous, addition polymerizable ethylenically unsaturated compound containing at least one terminal ethylenic group capable of forming a high polymer by photoinitiated addition polymerization, in the presence of an addition polymerization initiator therefor activatable by actinic light, in an amount of 97 to 3 parts by weight, (c) from 0.0001 to 6% by weight of the total composition of such an initiator, and (d) from 0.0001 to .01% by weight of the total composition of a chalcogen selected from the group consisting of sulfur and selenium.

4. A process for forming an image which comprises exposing to actinic light, imagewise, a solid photopolymerizable layer comprising:

(a) a preformed compatible macromolecular polymer binding agent that forms coherent, solid films in an amount of 97 to 3 parts by weight, (b) a non-gaseous, addition polymerizable ethylenically unsaturated compound containing at least one terminal ethylenic group capable of forming a high polymer by photoinitiated addition polymerization, in the presence of an addition polymerization initiator therefor activatable by actinic light, in an amount of 97 to 3 parts by weight.

(c) from 0.0001 to 6% by weight of the total composition of such an initiator, and (d) from 0.0001 to .01% by weight of the total composition of a chalcogen selected from the group consisting of sulfur and selenium.

5. A process according to claim 4 wherein said step of exposing the layer is through a continuous tone photographic image.

6. A process according to claim 4 wherein said step of exposing the layer is through an image-bearing transparency having transparent areas of uniform optical density and opaque areas of uniform optical density.

7. A process according to claim 6 wherein said transparency embodies halftone images.

No references cited.

NORMAN G. TORCHIN, *Primary Examiner.*

R. H. SMITH, *Assistant Examiner.*